United States Patent [19]
Foederl et al.

[11] Patent Number: 6,119,706
[45] Date of Patent: Sep. 19, 2000

[54] APPARATUS FOR CLEANING ELECTRONIC COMPONENTS

[75] Inventors: Frank X. Foederl, Berkeley Heights, N.J.; Carson Ray Lomax, High Point; David Cutlar Sunderland, Burlington, both of N.C.

[73] Assignee: Lucent Technologies Inc., Murray Hill, N.J.

[21] Appl. No.: 09/266,461

[22] Filed: Mar. 11, 1999

Related U.S. Application Data

[63] Continuation-in-part of application No. 08/934,993, Sep. 22, 1997, Pat. No. 5,928,432.

[51] Int. Cl.$^7$ ...................................................... B08B 3/10
[52] U.S. Cl. ............................ 134/76; 134/105; 134/113; 134/148; 134/182
[58] Field of Search ................................ 134/76, 105, 107, 134/108, 113, 148, 182

[56] References Cited

U.S. PATENT DOCUMENTS

| | | | |
|---|---|---|---|
| 1,202,154 | 10/1916 | Gerard et al. .......................... | 134/76 X |
| 2,036,261 | 4/1936 | Dinley ..................................... | 134/76 X |
| 4,881,561 | 11/1989 | Schwarzwalder ......................... | 134/76 |
| 4,886,082 | 12/1989 | Kato et al. ............................ | 134/107 X |
| 5,000,206 | 3/1991 | Kramer et al. ....................... | 134/148 X |
| 5,048,548 | 9/1991 | Ramsey, Jr. .......................... | 134/105 X |
| 5,377,704 | 1/1995 | Huddle ..................................... | 134/76 |
| 5,417,769 | 5/1995 | Gerard et al. ........................ | 134/105 X |

*Primary Examiner*—Philip R. Coe
*Attorney, Agent, or Firm*—Thomas, Kayden, Horstemeyer & Risley LLP

[57] ABSTRACT

A degreasing and cleaning apparatus for cleaning circuit boards and the like has a first, wash sump containing a boiling, environmentally friendly wash material and a second, rinse, sump containing an environmentally friendly rinse material, separated by a weir. An anti-splash and surge control fence is mounted on top of the weir to control splashing and spill-over between the sumps. The wash sump contains a plurality of spray wands and a programmed hoist pans the carrier of the boards past the spray wands in incremental steps. After the wash cycle, the carrier is introduced into the second, rinse, sump and then given a final vapor rinse. The temperature ranges in which the apparatus is operated yield optimum cleaning.

18 Claims, 4 Drawing Sheets

WASH (SUMP 16)  RINSE (SUMP 17)

the basket is passed to the second sump, where it is rinsed.
APPARATUS FOR CLEANING ELECTRONIC COMPONENTS

RELATED APPLICATIONS

This application is a continuation-in-part of U.S. patent application Ser. No. 08/934,993 of F. Foederl et al., filed Sep. 22, 1997, and now U.S. Pat. No. 5,928,432.

FIELD OF INVENTION

This invention relates to a cleaning system for electronic parts and, more particularly, to an apparatus for solvent cleaning of circuit card assemblies.

BACKGROUND OF THE INVENTION

In the manufacture of circuit card assemblies (CCAS) such as multi-layer ceramic cards, the ceramic or other such substrates are populated with a variety of devices, including leadless chip carriers having typical board to device clearances of, for example, 0.006 inches and generally a minimum stand-off of 0.004 inches. In as much as solder and solder flux mountings and connections are most commonly used in mounting and connecting the various devices to the substrate, the extremely close spacing between device and board traps flux residues that must be removed to avoid problems in subsequent manufacturing steps, such as when the CCAs are conformally coated. The removal of flux residues has been generally accomplished through the use of vapor degreasing equipment.

Typical of such prior art degreasing equipment is a dual sump assembly in which the first sump contains a degreasing solvent which is heated and the second sump also contains the same solvent. The first sump functions as a wash bath and the second sump functions as a rinse bath. A suitable conveyor means introduces a basket, for example, containing one or more CCAs into the heated solvent of the first sump. After a washing period, which may be of any suitable duration, the basket is removed from the liquid of the first sump and lifted into a vapor area above the sump through which it is passed to the second sump, where it is rinsed.

In some cleaning applications, it is highly desirable, if not mandatory, that the contaminant level after cleaning not exceed ten micrograms per square inch on the circuit board. More particularly, the ionic contamination of the surface of the board, which generally comprises a ceramic substrate populated with various devices and is, for example, six inches square, must be lower than ten micrograms (NaCi equivalent) per square inch; ion chromatography requirements by type must be less than one microgram per square inch for each of the ions chloride, bromide, and sulfate- and there should be no visible residue left on the surface under 7× magnification. Heretofore, excellent cleaning results which met the foregoing criteria had been achieved with 1,1,1 trichlorethane in both of the sumps of the previously described vapor degreasing equipment. However, that particular solvent is a Class I ozone depleting substance (ODS-1) CFC covered under the Montreal Protocol, the use of which is restricted by U.S. Environmental Protection Agency regulations, and international treaties.

As a consequence of the foregoing, it is extremely important that there be a cleaning system for circuit boards that uses environmentally "friendly" materials while meeting or exceeding the aforementioned cleanliness criteria, with the apparatus of the system being capable of achieving the desired results utilizing such materials.

SUMMARY OF THE INVENTION

The present invention is a cleaning apparatus which utilizes co-solvent cleaning wherein the solvents are environmentally friendly and which meets the specified criteria for cleanliness.

In a preferred embodiment of the invention, a tank has a transverse weir therein forming first and second sumps. The first sump contains as wash agent, for example, a mixture of a solvating liquid agent and an ether, which is non ozone depleting and of very low toxicity. Such material is commercially available from for example, Petroferm Inc. whose designation of the material is Solvating Agent 70 (SA70)®. The second sump contains a liquid rinse agent which comprises an ether or a mixture of two or more ethers. Such material is commercially available from the 3M™ Company with the designation HFE-7100®. Both the wash solvent and the rinse solvent are binary compounds and are environmentally "friendly" and their use is not restricted by EPA regulations. In addition, both materials are of low toxicity and only minimally hazardous in use. It has been found that good results are obtainable with a wide variety of binary, environmental friendly, compounds.

It has been found that best results are attainable by boiling the solvating cleaning mixture in the first sump. To this end, the first sump contains, or has mounted in proximity thereto, suitable heating means such as coils for bringing the mixture therein to a boil. However, the boiling point of the solvating agent in the first sump is approximately 350° F. which is considerably higher than is desirable. The ether mixed with the solvating agent affords a measure of temperature control for the mixture. On the other hand, the boiling point of the rinse material is approximately 140° F., and it can be used to reduce the boiling point of the mixture in the first sump by the introduction thereof in measured amounts into the first sump mixture which occurs upon heating when the rinse solvent overflows the weir into the wash solvent. In addition, if there is too great a reduction in boiling point of the wash mixture, measured amounts of rinse mixture may be taken out of the rinse bath to reduce or stop the overflow. It has been found that a boiling point range for the solvating agent in the first sump of approximately 180° F. to 200° F. yields satisfactory results, with the range 183° F. to 187° F. yielding excellent results. The temperature range is achieved through the introduction of proper amounts of rinse agent on an empirical basis. Thus, temperatures are considerably higher than is usual in degreasing or cleaning processes. As a further temperature control, the first sump has a thermocouple therein for monitoring the temperature of the wash bath to determine if it is at or near the desired operating temperature, and the signal from which may be directed to a visual indicator and alarm and to a heating coil control if desired. Thus, the boiling point of the wash solvent in the first sump is governed or controlled by the addition or removal of rinse agent, and the temperature is maintained by the heating coils and thermocouple arrangement.

A hoist or other type conveyor is mounted over the tank for conveying a basket containing circuit boards along the length of the tank. The hoist is programmed to lower the basket into the wash solvent in the first sump, then to raise the basket and pass it through a vapor volume which forms above the tank to the rinse sump where it lowers the basket into the rinse liquid in the second sump. In order that the washing action in the first sump be enhanced, sub-surface arrays of relatively high pressure, e.g., 50 psig, nozzles are located in the first sump for increasing the agitation of the wash solvent. The hoist is programmed to move the basket vertically in incremental steps past the nozzles, thereby panning the basket past the several nozzles and assuring total coverage by the nozzles with no residual voids.

When the basket is lowered into the rinse solvent, it displaces a relatively large volume of rinse fluid which tends to spill over the weir into the first sump and cause a relatively violent boiling reaction. In addition, this spill over functions as a purge to remove traces of cleaning solvent introduced by the rinsing process. A fence is mounted along the top of the weir and has spaced holes therein to allow spill over but to prevent too sudden surges of overflow. The fence also prevents wash solvent from splashing over the weir into the rinse bath. Also, when a large surge of rinse agent overflows into the boiling wash agent, it causes a sudden dramatic increase in the boiling action of the wash agent which tends to flow over the weir, in the absence of the fence, and contaminate the rinse material, and it also causes a sharp decrease in the temperature of the wash agent. As a consequence, when the fence is used, the rinse bath remains substantially unadulterated and sudden changes in temperature of the wash bath are minimized. After the basket and the boards therein have been rinsed in the rinse bath, the hoist raises the basket above the tank and the rinse vapor volume to a region where it is cooled, and then the basket is lowered into the vapor volume where, because it has been cooled, the vapor, which is virtually pure rinse solvent, condenses on the basket and the boards to perform a final rinse, after which the boards are passed to an inspection stage.

The system as described is a closed, recirculating system in which pumps are used to recirculate both the washing solvent and, separately, the rinsing solvent, with appropriate filtering where necessary. Preferably the two sump tank is contained in a protective housing, and, for optimum cleanliness of the product, the entire system is contained, and the process performed, within a clean room.

The numerous features of the present invention and the advantages thus realized will be more apparent from the following detailed description, read in conjunction with the accompanying drawings.

DETAILED DESCRIPTION

Figure 1:
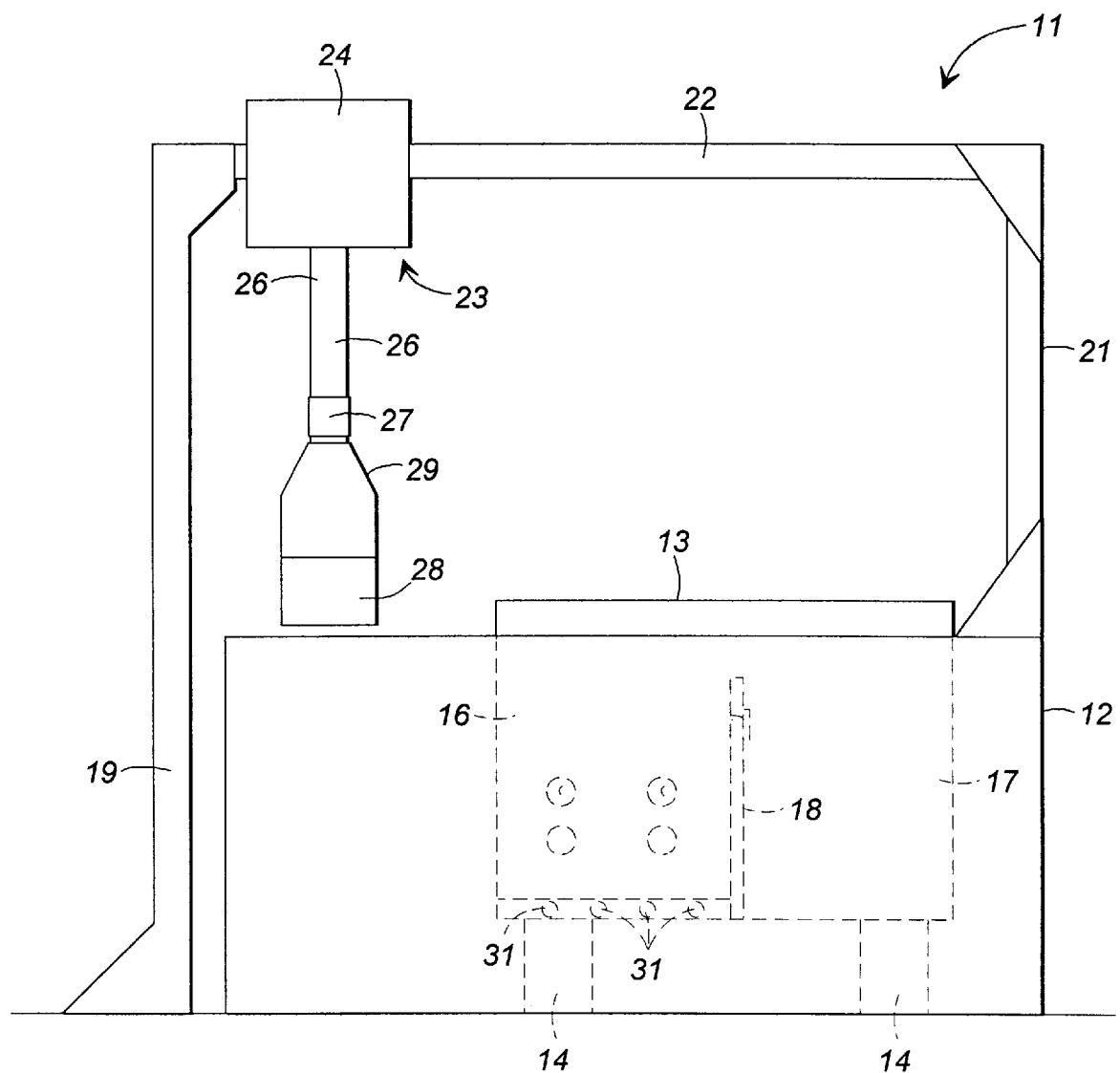
FIG. 1 is a side elevation view of the cleaning apparatus of the present invention.

FIG. 1 depicts the apparatus of the preferred embodiment of the invention which comprises a cleaning system 11. Inasmuch as cleanliness is the major consideration, the system 11 is preferably located in a clean room, not shown, although this location is not limiting.

System 11 comprises cabinet or other type container 12 of suitable material, such as steel or stainless steel within which is contained a tank 13, shown in dashed lines. Tank 13 is shown mounted on support members 14, however, other means for locating the tank within container 12 may be used. As is shown in dashed lines, tank 13 is divided into two adjacent sumps 16 and 17 separated by a weir 18. The details and various components of the tank 13 and sumps 16 and 17 will be discussed more fully hereinafter, in particular with regard to FIG. 2. Support member 19 and 21 support a hoist track 22 above the tank 13 as shown. Mounted on track 22 and adapted to travel therealong is a hoist 23 which comprises a control and actuating unit 24, descending cables 26, and a hook 27. In use, a basket 28, preferably of a metallic mesh is attached to hook 27 by a handle 29. As will be apparent hereinafter, basket 28 is adapted to carry a number, e.g., ten, of circuit boards to be cleaned. The cable and hook arrangement depicted in FIG. 1 is a preferred arrangement, however, it is to be understood that other types of carriers for the basket 28 may be used. It is desirable, in any case, that the hoist arrangement allow quick attachment and detachment of the basket 28, with the attachment securely holding the basket 28. As will be discussed more fully hereinafter, actuating unit is programmed to raise and lower the basket 28, thereby lowering it into the sumps 16 and 17, lifting it, and moving it longitudinally from one sump to the other. In the embodiment of the present invention depicted in FIG. 1, sump 16 contains a washing bath and sump 17 contains a rinsing bath, and the basket is, during the cleaning operation, moved from the sump 16 to the sump 17 by the actuator 24 traveling on track 22. The hoist arrangement 23 of FIG. 1, wherein the actuator 24 travels along a track 22 is only one of a number of possible hoist arrangements for fulfilling the foregoing requirements and others to be discussed in conjunction with subsequent figures.

Figure 2:
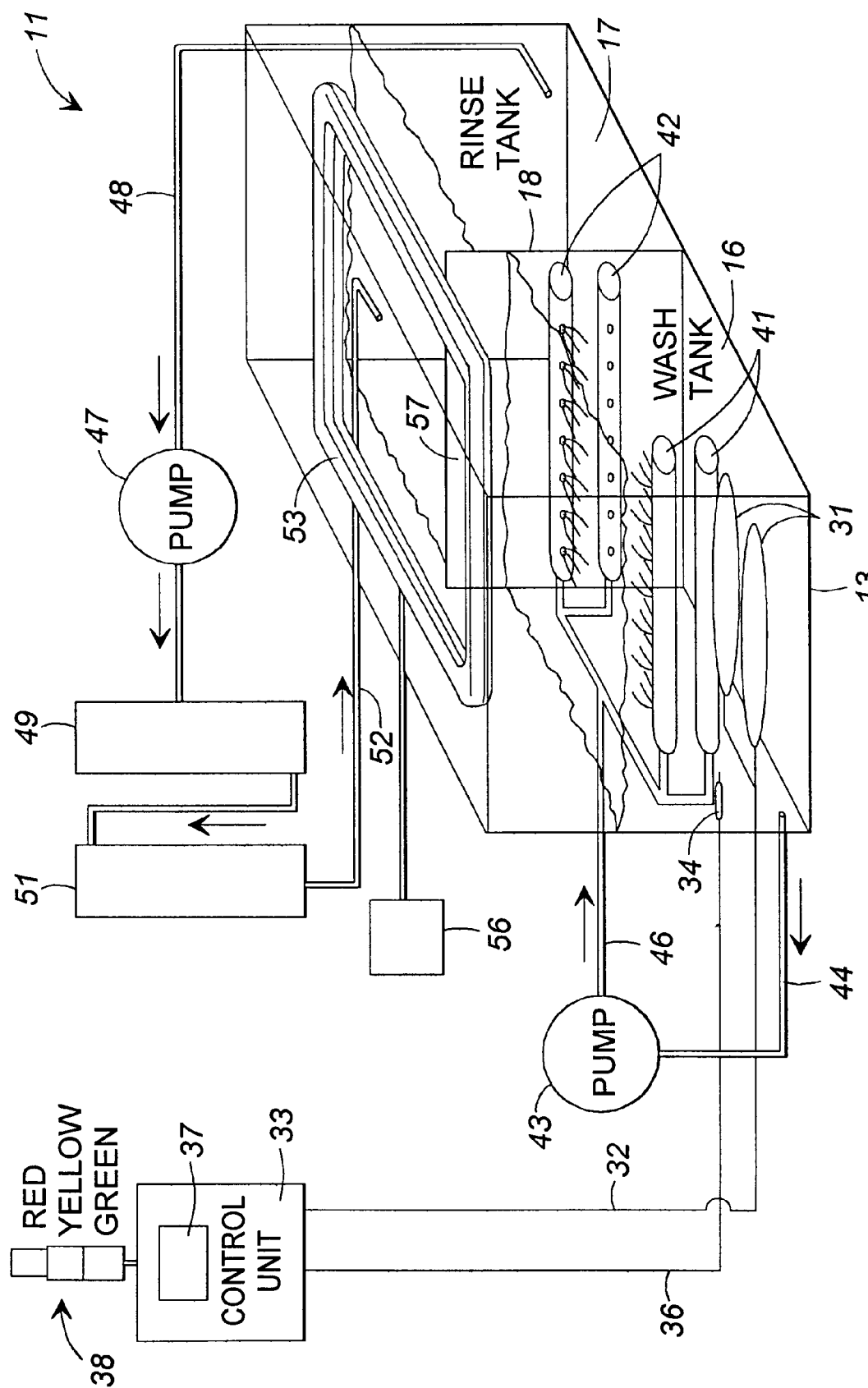
FIG. 2 is a perspective diagrammatic view of that portion of the apparatus of the invention embodying the dual sumps and the components used therewith.

The various components of the cleaning system 11, their location, and their relationship to other components are shown more clearly in FIG. 2. Located at the bottom of wash sump 16 are heating coils 31 which are connected, via line 32, to a temperature monitoring and control unit. The heating coils 31 may be located in a space below the bottom of sump 16, as shown in FIG. 1. As discussed hereinbefore, the wash solvent mixture (not shown) within sump 16 is boiled, with a desirable boiling temperature being 183° F. to 187° F. a thermocouple 34 which is immersed in the fluid in wash sump 16 is also connected via wire 36, to unit 33. Unit 33 monitors the temperature of the wash bath in sump 16 and gives an indication through an alphanumeric read out 37 of the operating temperature and a color status indicator (green, yellow, red) 38 gives a quick indication of operating temperature. Within sump 16 are mounted, by any suitable means, first and second pairs of spaced spray wands 41 and 42, each wand having a plurality of nozzles or openings for delivering wash fluid under pressure to the space between the pairs 41 and 42. A pump 43, which recirculates the wash solvent through conduits 44 and 46 supplies the fluid to the wands 41 and 42. The operation of the spray wands 41 and 42 will be discussed more fully hereinafter. The sump 16, during operation, is filled to a point below the top of the weir 18 with the proper wash solvent, i.e., a solvating liquid agent which may, for example, comprise a mixture of tetradeconoic acid, 1-methylethyl ester and dipropylene glycol n-butyl ether (Petroferm SA70®) which, as pointed out in the preceding discussion, is non-ozone depleting and of very low toxicity. Petroferm SA70® is only one of a number of suitable solvating liquid agents that are commercially available. In addition, approximately 20–30% of the fluid consists of rinse agent. This lowers the boiling point to the range of operating temperatures. After the apparatus stabilizes thermally, the final target temperature is attained by manually adding or subtracting the rinse agent. The level of the liquid in sump 16 should be sufficiently below the top of the weir 18 so that the boiling wash mixture of SA70® and HFE7100 does not tend to spill over into sump 17. On the other hand, sump 17 is filled with the proper rinsing agent, which may be, for example, a mixture of (nonaflourabutyl)

methyl ether and (nonaflouroisobutyl) methyl ether (3M™ HFE7100) to a point just below the top of the weir. As seen in FIG. 2, a pump 47 extracts rinse agent from sump 17 through a conduit 48 and passes it through a water separator 49 and a filter 51, and returns the cleaned fluid to sump 17 through conduit 52.

A pair of cooling coils 53 is mounted within tank 13 above the sumps 16 and 17 and are controlled by suitable means, represented by block 56. The function of the cooling coil will be clear from the following discussion of the operation of the system.

Mounted on top of weir 18 is a fence 57 for controlling overflow of fluid between the two sumps 16 and 17, and splash back of fluid between sumps 16 and 17.

Figure 3:
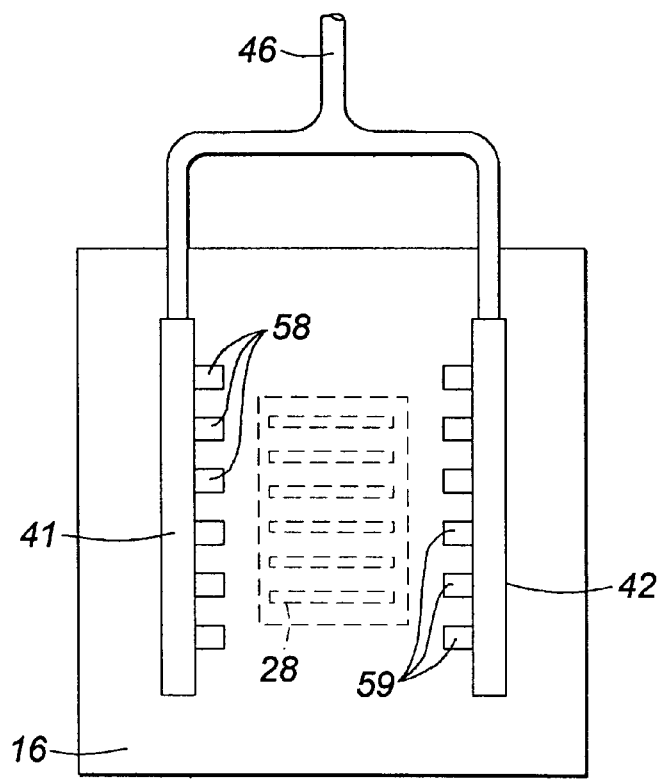
FIG. 3 is a plan view of the wash sump of the apparatus of the invention.
Figure 4:
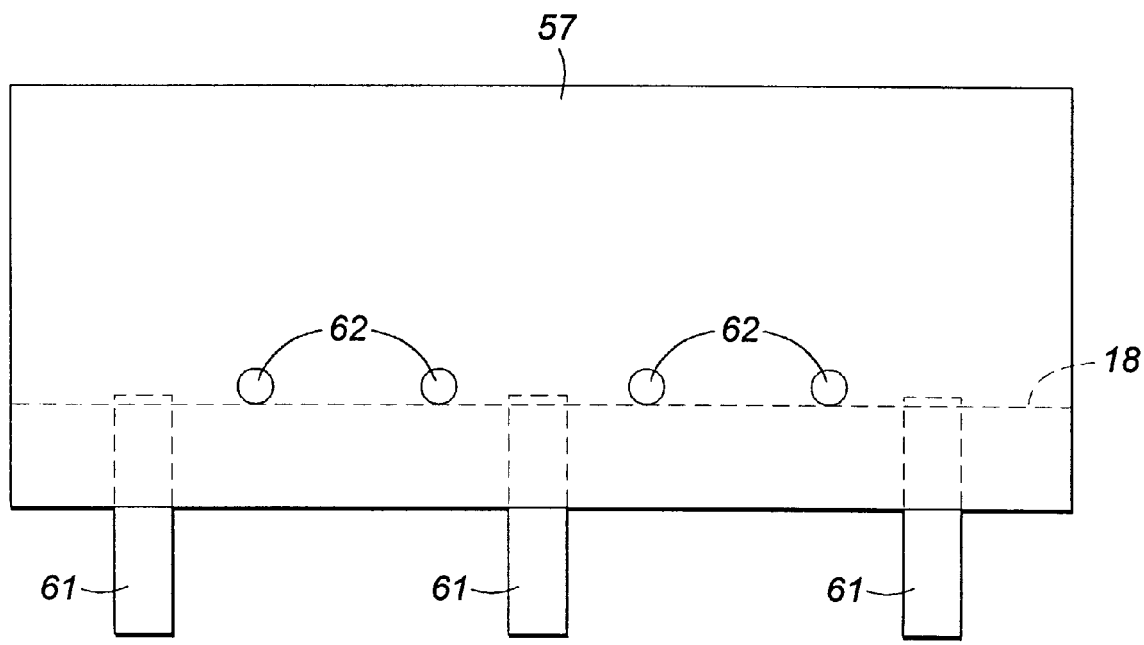
FIG. 4 is a front elevation view of the splash fence of the present invention.

FIG. 3 is a plan view of sump 16 showing the relationship of the board containing basket 28 to the spray wands 41 and 42. Basket 28, which may contain, for example ten circuit cards, when lowered into the wash solvent by hoist 23, passes between the pairs of wands 41 and 42 which, as pointed out hereinbefore, deliver relatively high pressure sprays from their several nozzles 58,58 and 59,59 into the already boiling liquid mixture, which impinge upon the mesh basket and its contents to insure a proper and thorough washing.

Figure 5:
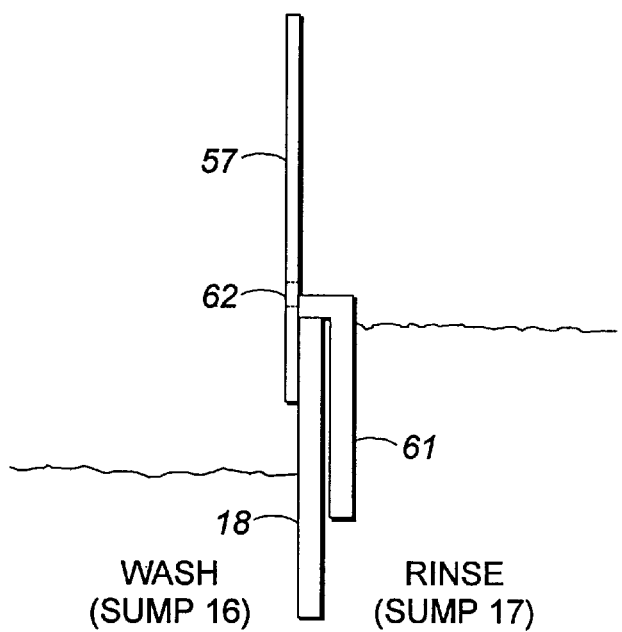
FIG. 5 is a side elevation view of the fence of FIG. 4 as mounted on the weir separating the two sumps.

During operation, it is necessary to keep the rinse bath clean, and also to prevent too sudden or too great a spill-over of fluid from one sump to the other. In order to further these desiderata, a fence 57 is mounted on top of the weir 18 by suitable means such as L-shaped brackets 61. As can be seen in FIG. 5, fence 57 is so located on weir 18 that any wash solvent impinging on its face or front surface, drains directly back into the wash bath, thereby minimizing contamination of the rinse bath. Fence 57 has an array of holes 62 arrayed across the width thereof to control fluid surges. Thus, when basket 28 is lowered into the rinse bath, thereby displacing an amount of rinse fluid, the holes 62 allow spill-over of the displaced fluid into sump 16, but at a controlled rate rather than as a large surge. The fence 57 is, therefore, a surge protector or preventor. At the same time, fence 57 protects the rinse bath from splashing of the wash bath fluid, which is in a state of agitation, into the rinse bath. Thus, the amount of contamination of the rinse bath as a result of such splashing is minimized.

Operation

Figure 6:
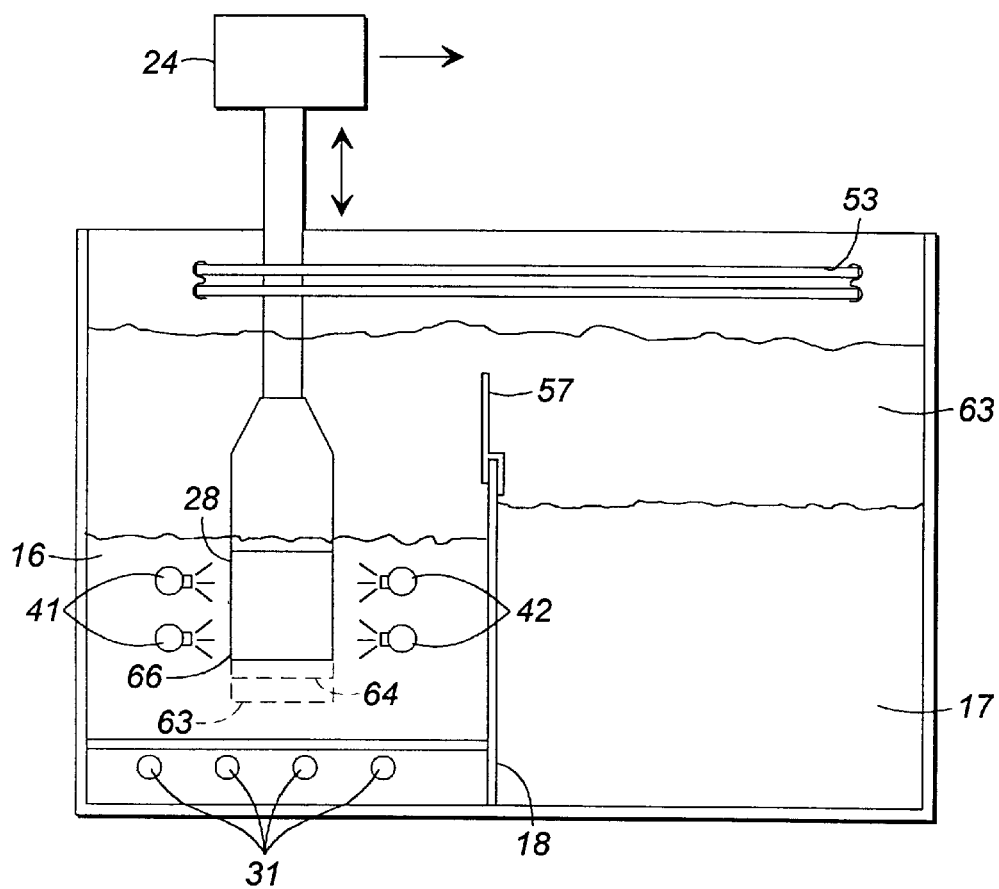
FIG. 6 is a side elevation view of the interior of the tank containing the two sumps.

When the sumps 16 and 17 contain the proper levels of bath liquids, e.g., three-quarters full for the wash sump 16 and substantially full for the rinse sump 17, the heating elements are turned on and the temperatures rise until the wash solvent commences to boil. At this point, if the boiling temperature is too high, it can be reduced by the addition of, for example, HFE 7100®, the material forming the rinse bath, in measured amounts, until the desired boiling point for the wash bath is reached. If the boiling temperature is too low, HFE 7100® is removed from the rinse bath. For a target boiling temperature of 185° F. for the wash bath, the temperature of the rinse bath will be approximately 140° F. At these temperatures, a vapor zone 63, as shown in FIG. 6 is created over the sumps, which for the most part is confined between the upper surfaces of the baths and the cooling coil 53. After a period of time, the system will stabilize at the boiling temperature for the wash bath and a lower temperature for the rinse bath. Adjustments of boiling temperature can be made by the addition or removal of HFE 7100® from the wash bath in measured amounts, and ultimately the system stabilizes at the desired wash temperature, i.e., the wash solvent mixture boiling temperature.

After the temperature has stabilized, and the cards or boards to be cleaned have been placed in the basket 28, the basket is lowered through the vapor volume or stratum into the boiling wash bath in sump 16 by means of hoist assembly 23, to a first depth 63, indicated by dashed lines in FIG. 6, where it is impinged by the pressure jets from wands 41 and 42, as shown in FIG. 6, which create a turbulent region therebetween. The basket 28 remains in position 63 in the turbulence for a suitable period, e.g., ten minutes, and then is raised by programmed hoist 23, 24 to a second position 64 shown in dashed lines in FIG. 6 where it remains for a suitable period, e.g., ten minutes. Basket 28 is then raised to a third position 66, as seen in FIG. 6, where it remains for a period such as, for example, ten minutes, and is then raised above the sump into the vapor zone. Thus, the basket 28 is panned past the spray wands 41 and 42 in incremental steps, thereby insuring that the boards contained therein are thoroughly subjected to the sprays from the wands 41 and 42. As discussed hereinbefore, the movements of the basket 28 into and out of the wash sump 16, as well as the agitation of the wash solvent within that sump causes some splashing of the liquid. Fence 57 substantially prevents the splashed material from reaching the rinse liquid, thereby protecting the rinse liquid in sump 17 from contamination.

After completion of the wash cycle, as set forth in the foregoing, the basket 28 is moved by the hoist assembly 23 to a position over the rinse sump 17, and is then lowered into the rinse liquid. Fence 57 in this step functions to prevent excess surge spill-over of the displaced rinse liquid into sump 16, as discussed in the foregoing. After a suitable period of time, e.g., five minutes, the basket is raised to the cool zone, defined by cooling coils 53, where it is cooled and then raised into the air above the cool zone. The now cooled basket is then lowered into the vapor zone 63, where the heated vapor condenses on the basket and its contents to produce a vapor rinse. Inasmuch as the rinse agent in the vapor zone is very pure, the vapor rinse is quite effective.

The basket 28 and its contents are then raised into the cool zone, where they are again cooled and then into the air above the cool zone before being lowered into the vapor zone again for a second "flushing" by the rinse vapor. It has been found in practice that these consecutive vapor "soaks", each of, for example, ninety seconds duration, yield superior rinsing results. After the last vapor rinse the basket 28 is raised into the cooling zone for a brief cooling and then can be returned to the start position, or to whatever position in the system where the basket 28 is to be unloaded.

The tank 13 has an unusually high free board so that the volume enclosed thereby is protected from drafts or other air movement in the ambient surroundings. As a consequence, the vapor zone remains reasonably still so that there is little escape of rinse agent therefrom.

Table A, appended hereto, details the foregoing process on a step-by-step basis. It is to be understood that various of the parameters discussed, such as times, may be varied somewhat for particular applications, but the overall process will remain substantially the same.

The apparatus and method of the invention, as set forth in the foregoing description of a preferred embodiment thereof, achieves excellent cleaning results for circuit boards which, for the most part, exceed established or standard criteria, with the use of environmentally friendly materials of low toxicity.

In concluding the detailed description, it should be noted that it will be obvious to those skilled in the art that many variations and modifications may be made to the preferred embodiment without substantially departing from the principles of the present invention. All such variations and modifications are intended to be included herein as within the scope of the present invention, as set forth in the claims. Further, in the claims, the corresponding structures, materials, acts, process steps, and equivalents of all means or step plus function elements are intended to include any structure, material, process steps or acts for performing the functions with other claimed elements as specifically claimed.

TABLE A

| STEP | FUNCTION | DATA | INPUTS | DESCRIPTION |
|------|----------|------|--------|-------------|
| 00 | RESET | | | |
| 01 | IF A > | 03 | 01 | Raise Basket |
| 02 | GO TO | 01 | 01 | Raise Basket |
| 03 | S | 10:00 | | Pause for 10 seconds |
| 04 | CT | 0183 | 02 | Move Host to Boiling Sump |
| 05 | S | 05:00 | | Pause for 5 seconds |
| 06 | CT | 0210 | 00, 01 | Lower Basket Into Boiling Vapor |
| 07 | S | 05:00 | | Pause for 5 seconds |
| 08 | CT | 0090 | 00, 01 | Lower Basket Into Boiling Liquid |
| 09 | M | 10:00 | | Pause for 10 minutes |
| 10 | CT | 0004 | 01 | Raise Basket |
| 11 | M | 10:00 | | Pause for 10 minutes |
| 12 | CT | 0006 | 01 | Raise Basket |
| 13 | M | 10:00 | | Pause for 10 minutes |
| 14 | CT | 0135 | 01 | Raise Basket |
| 15 | S | 05:00 | | Pause 5 seconds |
| 16 | CT | 0130 | 02 | Move Hoist to Rinse Sump |
| 17 | S | 10:00 | | Pause 10 seconds |
| 18 | CT | 0135 | 00, 01 | Lower Basket Into Rinse Liquid |
| 19 | M | 05:00 | | Pause 5 minutes |
| 20 | CT | 0155 | 01 | Raise Basket To Cool Zone |
| 21 | S | 20:00 | | Pause 20 seconds |
| 22 | CT | 0120 | 01 | Raise Basket to Air |
| 23 | M | 05:00 | | Pause 5 minutes |
| 24 | CT | 0205 | 00, 01 | Lower Basket Into Rinse Vapor |
| 25 | S | 90:00 | | Pause 90 seconds |
| 26 | CT | 0100 | 01 | Raise Basket To Cool Zone |
| 27 | S | 20:00 | | Pause 20 seconds |
| 28 | CT | 0115 | 01 | Raise Basket To Air |
| 29 | M | 5:00 | | Pause 5 minutes |
| 30 | CT | 0215 | 01 | Lower Basket To Rinse Vapor |
| 31 | S | 90:00 | | Pause 90 seconds |
| 32 | CT | 0100 | 01 | Raise Basket To Cool Zone |
| 33 | S | 20:00 | | Pause 20 seconds |
| 34 | If A | >36 | 01 | Raise Basket |
| 35 | GO TO | 34 | 01 | Raise Basket |
| 36 | S | 05:00 | | Pause 5 seconds |
| 37 | If B | >39 | 00, 02 | Return Hoist to Left |
| 38 | GO TO | 37 | 00, 02 | Return Hoist To Left |
| 39 | S | 05:00 | | Pause 5 seconds |
| 40 | CT | 0060 | 00, 01 | Lower Basket To Start Position |
| 41 | S | 05:00 | | Pause 5 seconds |
| 42 | GO TO | 00 | | Reset |
| 43 | | | | |
| 44 | | | | |
| 45 | | | | |
| 46 | | | | |

What is claimed is:

1. An apparatus for cleaning electronic components comprising: a tank member having a solvent containing volume; a weir dividing said volume into first and second sumps; said first sump being adapted to contain a wash solvent of non-ozone depleting material therein; said second sump being adapted to contain a rinse solvent of non-ozone depleting material therein different from said wash solvent; heating members with said first sump for heating the wash solvent contained therein to the boiling point thereof; a hoist assembly for introducing a basket containing components to be cleaned in said first sump for a wash cycle and for introducing said basket into said second sump subsequent to the wash cycle for a rinse cycle; and a surge controlling member on said weir for preventing at least a portion of the wash solvent contained in said first sump from splashing into said second sump.

2. An apparatus as claimed in claim 1 wherein said surge controlling member comprises a fence on top of said weir and extending thereacross, said fence having a plurality of holes therein for permitting controlled spillover of the material in said second sump into said first sump.

3. An apparatus as claimed in claim 2 wherein said fence further includes bracket members for mounting said fence on top of said weir, said bracket members being attached to said fence on a face thereof facing said rinse sump.

4. An apparatus as claimed in claim 1 and further comprising temperature sensing means in said first sump.

5. An apparatus as claimed in claim 4 and further comprising a temperature indicator means to which said temperature sensing means is connected.

6. An apparatus as claimed in claim 1 wherein said heating members for heating maintains said wash solvent at a temperature within a range of 180° F. to 200° F.

7. An apparatus as claimed in claim 6 wherein the operating temperature range is 183° F. to 187° F.

8. An apparatus as claimed in claim 1 and further comprising first and second pairs of sub-surface spray wands, one spray wand of each pair being located above the other spray wand of the pair, and said first and second pairs being spaced apart a distance to permit passage of said basket therebetween.

9. An apparatus as claimed in claim 8 wherein said hoist assembly is programmed to pass said basket between said pairs of spray wands in incremental steps.

10. An apparatus for cleaning electronic components comprising:
   a tank member having a solvent containing volume;
   a wall member dividing the volume into first and second sumps, said first sump being adapted to contain a wash solvent of non-ozone depleting material therein and said second sump being adapted to contain a rinse solvent of non-ozone depleting material therein different from the wash solvent;
   means associated with said first sump for heating the wash solvent contained therein to the boiling point thereof;
   a hoist assembly for introducing a basket containing components to be cleaned into said first sump for a wash cycle and for introducing said basket into said second sump subsequent to the wash cycle for a rinse cycle;
   sub-surface spray means within said first sump for increasing the agitation of the wash solvent, said hoist assembly being programmed to move said basket past said spray means during the wash cycle.

11. An apparatus as claimed in claim 10 wherein said sub-surface spray means comprises first and second spaced spray wands, spaced apart a distance to permit passage of the basket therebetween.

12. An apparatus as claimed in claim 10 wherein said sub-surface spray means comprises first and second pairs of spray wands, one spray wand of each pair being located above the other spray wand of the pair, and said first and second pairs being spaced apart a distance to permit passage of said basket therebetween.

13. An apparatus as claimed in claim 12 wherein said hoist assembly is programmed to pass said basket between said pairs of spray wands in incremental steps.

14. An apparatus as claimed in claim 10 and further including means for recirculating wash solvent through said sub-surface spray means.

15. An apparatus as claimed in claim 10 and further including a surge controlling member on said wall member for preventing at least a portion of the wash solvent contained in said first sump from splashing into said second sump.

16. An apparatus as claimed in claim 15 wherein said surge controlling member comprises a flat plate member having a plurality of holes drilled therein for controlling fluid flow.

17. An apparatus as claimed in claim 10 and further including means for establishing a cool zone above said first and second sumps.

18. An apparatus as claimed in claim 17 wherein said means for establishing a cool zone comprises at least one cooling zone above said sumps and spaced therefrom.

* * * * *